(12) United States Patent
Pan et al.

(10) Patent No.: US 9,751,774 B2
(45) Date of Patent: Sep. 5, 2017

(54) CESIUM BOROSILICATE COMPOUND, NONLINEAR OPTICAL CRYSTAL OF CESIUM BOROSILICATE, AND PREPARATION METHOD THEREFOR AND USE THEREOF

(71) Applicant: THE XINJIANG TECHNICAL INSTITUTE OF PHYSICS & CHEMISTRY, CHINESE ACADEMY OF SCIENCES, Urumqi, Xinjiang (CN)

(72) Inventors: Shilie Pan, Urumqi (CN); Hongping Wu, Urumqi (CN); Hongwei Yu, Urumqi (CN)

(73) Assignee: The Xinjian Technical Institute oh Physics & Chemistry, Chinese Academy of Sciences, Xinjiang (CN)

( * ) Notice: Subject to any disclaimer, the term of this patent is extended or adjusted under 35 U.S.C. 154(b) by 222 days.

(21) Appl. No.: 14/426,094

(22) PCT Filed: May 31, 2013

(86) PCT No.: PCT/CN2013/076584
§ 371 (c)(1),
(2) Date: Mar. 4, 2015

(87) PCT Pub. No.: WO2014/075436
PCT Pub. Date: May 22, 2014

(65) Prior Publication Data
US 2015/0225251 A1 Aug. 13, 2015

(30) Foreign Application Priority Data
Nov. 13, 2012 (CN) .......................... 2012 1 0452773

(51) Int. Cl.
*C01B 35/10* (2006.01)
*C30B 11/00* (2006.01)
(Continued)

(52) U.S. Cl.
CPC ............ *C01D 17/003* (2013.01); *C01D 17/00* (2013.01); *C30B 9/12* (2013.01); *C30B 11/003* (2013.01);
(Continued)

(58) Field of Classification Search
None
See application file for complete search history.

(56) References Cited

PUBLICATIONS

Bubnova, Rimma S. et al "XRD and DSC study of the formation and the melting of a new zeolite like borosilicate CsBSi5O12 and (Cs,Rb)BSi5O12 solid solutions", Zeitschrift fuer Kristallographie (2007), 222(2), 83-88. (Abstract only).*

\* cited by examiner

*Primary Examiner* — Wayne Langel
(74) *Attorney, Agent, or Firm* — Lewis Roca Rothgerber Christie LLP

(57) ABSTRACT

The present invention relates to a cesium borosilicate compound, a nonlinear optical crystal of cesium borosilicate, and a preparation method therefor and a use thereof. The cesium borosilicate compound has a chemical formula of $Cs_2B_4SiO_9$ and a molecular weight of 481.15, and is prepared using a solid phase method. The nonlinear optical crystal of the cesium borosilicate compound has a chemical formula of $Cs_2B_4SiO_9$ and a molecular weight of 481.15, does not have a center of symmetry, belongs to the tetragonal system with space group $I\bar{4}$ and unit-cell parameters $a=6.731(3)$ Å, $c=9.871(9)$ Å and $V=447.2(5)$ Å$^3$, and has a wide transmittance range. The shortest ultraviolet cutoff edge is smaller than 190 nm, the frequency doubling effect of the crystal is 4.6 KDP, and the crystal is grown by a (Continued)

high-temperature solution spontaneous crystallization method and a flux method. The crystal has advantages of high growth rate, being transparent and inclusion free, low cost having a wide transmittance range, high hardness, good mechanical property, being crack resistant and not prone to deliquescence, being easy to process and store, and the like. The crystal is widely applied to manufacturing of nonlinear optical devices such as frequency doubling generators, frequency up-converters, frequency down-converters or optical parametric oscillators.

14 Claims, 1 Drawing Sheet

(51) Int. Cl.
| | | |
|---|---|---|
| *G02F 1/355* | (2006.01) | |
| *C01D 17/00* | (2006.01) | |
| *C30B 9/12* | (2006.01) | |
| *C30B 29/22* | (2006.01) | |

(52) U.S. Cl.
CPC ............ C30B 29/22 (2013.01); G02F 1/3551 (2013.01); *C01B 35/10* (2013.01); *C01P 2002/70* (2013.01)

CESIUM BOROSILICATE COMPOUND, NONLINEAR OPTICAL CRYSTAL OF CESIUM BOROSILICATE, AND PREPARATION METHOD THEREFOR AND USE THEREOF

CROSS-REFERENCE TO RELATED APPLICATION(S)

This application is a National Phase Patent Application and claims priority to and benefit of International Application Number PCT/CN2013/076584, filed on May 31, 2013, which claims priority to and benefit of Chinese Patent Application Number 201210452773.4, filed on Nov. 13, 2012, the entire disclosures of which are incorporated herein by reference.

FIELD OF THE INVENTION

The present invention relates to a cesium borosilicate compound $Cs_2B_4SiO_9$ and a nonlinear optical crystal of cesium borosilicate $Cs_2B_4SiO_9$ as well as preparation method therefor and use thereof.

BACKGROUND OF THE INVENTION

Crystals having nonlinear optical effects are known as nonlinear optical crystals, wherein the nonlinear optical effects refer to frequency doubling, sum frequency, difference frequency, parameter amplification and other effects. Only crystals without a symmetric center could probably possess nonlinear optical effects. Utilizing the nonlinear optical effects of crystals, the nonlinear optical devices, such as second harmonic generator, up and down frequency converter and optical parametric oscillator, can be manufactured. The laser beam generated by a laser may be subjected to frequency conversion by a nonlinear optical device, thereby obtaining more laser beams with useful wavelength, which leads to wider application of the laser. Based on differences in materials' application wave range, the nonlinear optical crystals are classified into three types: ultraviolet, visible and infrared regions. The nonlinear optical crystals in the visible region are relatively ripe, while the nonlinear optical crystals in ultraviolet and deep ultraviolet regions still have some defects. The transmission cutoff edge and the frequency doubling wavelength of crystals cannot become shorter, which restricts the application of the laser in ultraviolet or deep ultraviolet wavelength regions. Therefore, it has become one of difficult points and future directions in the current study field of the nonlinear optical material to find a new nonlinear optical crystal material with excellent performance in ultraviolet wavelength regions.

SUMMARY OF THE INVENTION

One object of the present invention is to provide a cesium borosilicate compound having a chemical formula of $Cs_2B_4SiO_9$ with a molecular weight of 481.15, which is prepared by a solid-phase method.

Another object of the present invention is to provide a cesium borosilicate nonlinear optical crystal having a chemical formula of $Cs_2B_4SiO_9$ with a molecular weight of 481.15. The crystal does not have a symmetric center and belongs to a tetragonal crystal system. The space group of the crystal is $I\bar{4}$. The unit cell parameters are a=6.731(3) Å, c=9.871(9) Å, V=447.2(5) Å$^3$. The crystal exhibits a wide transmittance range. The shortest UV cut-off edge is lower than 190 nm. The powder frequency-doubling effect is 4.6 KDP.

Yet another object of the present invention is to provide a method for preparing the cesium borosilicate $Cs_2B_4SiO_9$ nonlinear optical crystal.

Further another object of the present invention is to provide a use of the cesium borosilicate nonlinear optical crystal.

The present invention also provides a cesium borosilicate compound having a chemical formula of $Cs_2B_4SiO_9$ with a molecular weight of 481.15, which is prepared by a solid-phase method.

A cesium borosilicate nonlinear optical crystal has a chemical formula of $Cs_2B_4SiO_9$ with a molecular weight of 481.15. The crystal does not have a symmetric center and belongs to a tetragonal system. The space group of the crystal is $I\bar{4}$. The unit cell parameters are a=6.731(3) Å, c=9.871(9) Å, V=447.2(5) Å$^3$. The crystal exhibits a wide transmittance range. The shortest ultraviolet cut-off edge is lower than 190 nm. The powder frequency-doubling effect is 4.6 KDP.

The method for preparing the cesium borosilicate nonlinear optical crystal comprises the following steps of:

a. a Cs-containing compound, a B-containing compound and a Si-containing compound are mixed uniformly at a molar ratio of Cs:B:Si=2:4:1, grinded carefully, loaded into a Φ100 mm×100 mm open type corundum crucible and then compressed tightly, the corundum crucible is placed into a muffle furnace, which is heated slowly to a temperature of 550° C., held at this temperature for 24 hours and then cooled down to room temperature; the mixture is taken out, grinded once again and then put back to the muffle furnace, which is heated to 650° C., held at this temperature for 24 hours and then cooled down to room temperature, the mixture is taken out, grinded for the third time and then put back to the muffle furnace, which is further heated to 700-900° C. and held at this temperature for 3-96 hours; the mixture is taken out and grinded to obtain the single-phase polycrystalline powder of $Cs_2B_4SiO_9$;

b. the obtained single-phase polycrystalline powder of the $Cs_2B_4SiO_9$ compound is mixed with a fluxing agent at a molar ratio of 1:0.5-10 and then loaded into a Φ80 mm×80 mm open type platinum crucible; the platinum crucible is heated to a temperature ranging from 630° C. to 900° C. and held at this temperature range for 5-80 hours to obtain a mixed melting liquid; the temperature is then decreased to 610-835° C. and further decreased to room temperature at a temperature-decreasing rate of 1-10° C./h, allowing for spontaneous crystallization to obtain a $Cs_2B_4SiO_9$ seed crystal;

alternatively, a Cs-containing compound, a B-containing compound and a Si-containing compound are mixed uniformly at a molar ratio of Cs:B:Si=2:4:1, loaded into a Φ80 mm×80 mm open type platinum crucible; the platinum crucible is heated to a temperature ranging from 630° C. to 900° C. and held at this temperature range for 5-80 hours to obtain a mixed melting liquid; the temperature is then decreased to 610-835° C. and further decreased to room temperature at a temperature-decreasing rate of 1-10° C./h, allowing for spontaneous crystallization to obtain a $Cs_2B_4SiO_9$ seed crystal;

c. crystals are grown in the mixed melting liquid the obtained $Cs_2B_4SiO_9$ seed crystal is attached onto a seed crystal rod and then for forming the seed crystal from the top of a crystal growing furnace; the seed crystal is preheated on the surface of the mixed melting liquid for 10 minutes, and then immersed underneath the liquid surface so that the seed crystal is remelted in the mixed melting liquid; the temperature is kept for 30 minutes, and decreased rapidly to a temperature ranging from 610° C. to 745° C.;

d. The temperature is further decreased at a rate of 2° C./day and the seed crystal rod is rotated at a rotation rate of 10 rpm; after the crystal stops growing, the crystal is drawn out of the liquid surface and cooled down to room temperature at a rate of 5-50° C./h to obtain a colorless and transparent large-size crystal of $Cs_2B_4SiO_9$.

Said Cs-containing compound is $Cs_2CO_3$, $CsNO_3$, $Cs_2O$, $CsOH$, $CsHCO_3$ or $Cs_2C_2O_4$; said Si-containing compound is $SiO_2$; said B-containing compound is $H_3BO_3$ or $B_2O_3$.

Said fluxing agent is $Cs_2CO_3$, a $Cs_2CO_3$—$H_3BO_3$ system, a PbO—$H_3BO_3$ system, or a $Cs_2CO_3$PbO system.

In the $Cs_2CO_3$—$H_3BO_3$ system, the molar ratio of $Cs_2CO_3$ to $H_3BO_3$ is 1-51-3; in the PbO—$H_3BO_3$ system, the molar ratio of PbO to $H_3BO_3$ is 1-5:1-3; and in the $Cs_2CO_3$—PbO system, the molar ratio of $Cs_2CO_3$ to PbO is 1-5:0.2-3.

The invention provides a use of said cesium borosilicate nonlinear optical crystal, wherein the cesium borosilicate nonlinear optical crystal is used for preparing double frequency generator, up frequency converter, down frequency converter or optical parametric oscillator.

As for said cesium borosilicate compound and said cesium borosilicate nonlinear optical crystal, and preparation method and use thereof of the present invention, in the preparation of the cesium borosilicate compound, the solid-phase method is adopted after uniformly mixing the starting materials comprising Cs, Si and B at a molar ratio of Cs:B:Si=2:4:1, the mixture is heated to a temperature ranging from 700° C. to 900° C. to obtain a compound having a chemical formula of $Cs_2B_4SiO_9$ (in principle, general chemical synthesis methods can be used to prepare the $Cs_2B_4SiO_9$ compound, the solid-phase reaction method is preferred in the present invention).

Said $Cs_2B_4SiO_9$ compound can be prepared according to the following reaction equations:

$$Cs_2CO_3+SiO_2+4H_3BO_3 \rightarrow Cs_2B_4SiO_9+CO_2\uparrow+6H_2O\uparrow; \quad (1)$$

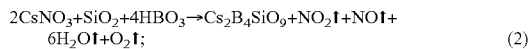
$$2CsNO_3+SiO_2+4HBO_3 \rightarrow Cs_2B_4SiO_9+NO_2\uparrow+NO\uparrow+6H_2O\uparrow+O_2\uparrow; \quad (2)$$

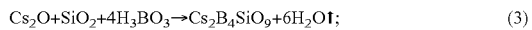
$$Cs_2O+SiO_2+4H_3BO_3 \rightarrow Cs_2B_4SiO_9+6H_2O\uparrow; \quad (3)$$

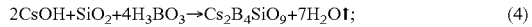
$$2CsOH+SiO_2+4H_3BO_3 \rightarrow Cs_2B_4SiO_9+7H_2O\uparrow; \quad (4)$$

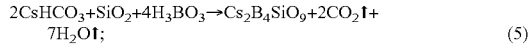
$$2CsHCO_3+SiO_2+4H_3BO_3 \rightarrow Cs_2B_4SiO_9+2CO_2\uparrow+7H_2O\uparrow; \quad (5)$$

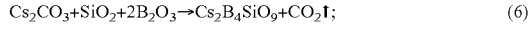
$$Cs_2CO_3+SiO_2+2B_2O_3 \rightarrow Cs_2B_4SiO_9+CO_2\uparrow; \quad (6)$$

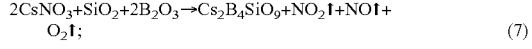
$$2CsNO_3+SiO_2+2B_2O_3 \rightarrow Cs_2B_4SiO_9+NO_2\uparrow+NO\uparrow+O_2\uparrow; \quad (7)$$

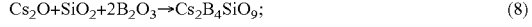
$$Cs_2O+SiO_2+2B_2O_3 \rightarrow Cs_2B_4SiO_9; \quad (8)$$

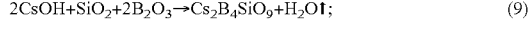
$$2CsOH+SiO_2+2B_2O_3 \rightarrow Cs_2B_4SiO_9+H_2O\uparrow; \quad (9)$$

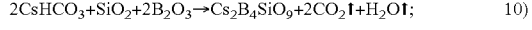
$$2CsHCO_3+SiO_2+2B_2O_3 \rightarrow Cs_2B_4SiO_9+2CO_2\uparrow+H_2O\uparrow; \quad (10)$$

$$Cs_2C_2O_4+SiO_2+2B_2O_3 \rightarrow Cs_2B_4SiO_9+CO_2\uparrow+CO. \quad (11)$$

The $Cs_2B_4SiO_9$ nonlinear optical crystal having a millimeter-order size can be obtained by using the method for preparing the cesium borosilicate nonlinear optical crystal as described in the present invention. The corresponding $Cs_2B_4SiO_9$ nonlinear optical crystal having a larger size can be obtained by using a large-size crucible as well as by prolonging growing cycle of the crystal. During the growth of the $Cs_2B_4SiO_9$ nonlinear optical crystal, the crystal grows up easily, is transparent and free of inclusions, the advantages lie in fast growth, low cost, easy access to large-size crystals and the like.

The invention provides a use of the large-size $Cs_2B_4SiO_9$ nonlinear optical crystal obtained by using the method described in the present invention, wherein the crystal blank is oriented based on crystallographic data of the crystal, cut according to a desired angle, thickness and cross-sectional size and polished on the light transmission surface of the crystal, and then the crystal obtained can be used as a nonlinear optical device. The $Cs_2B_4SiO_9$ nonlinear optical crystal has advantages in broad light transmission wave bands, stable physical and chemical properties and high mechanical hardness, being crack resistant and not prone to deliquescence, but easy for cutting, polishing processing, preservation and the like.

PREFERRED EMBODIMENTS OF THE INVENTION

Example 1

A $Cs_2B_4SiO_9$ compound was synthesized by using the solid-phase method according to the following reaction equation:

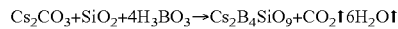
$$Cs_2CO_3+SiO_2+4H_3BO_3 \rightarrow Cs_2B_4SiO_9+CO_2\uparrow 6H_2O\uparrow$$

Figure 1:
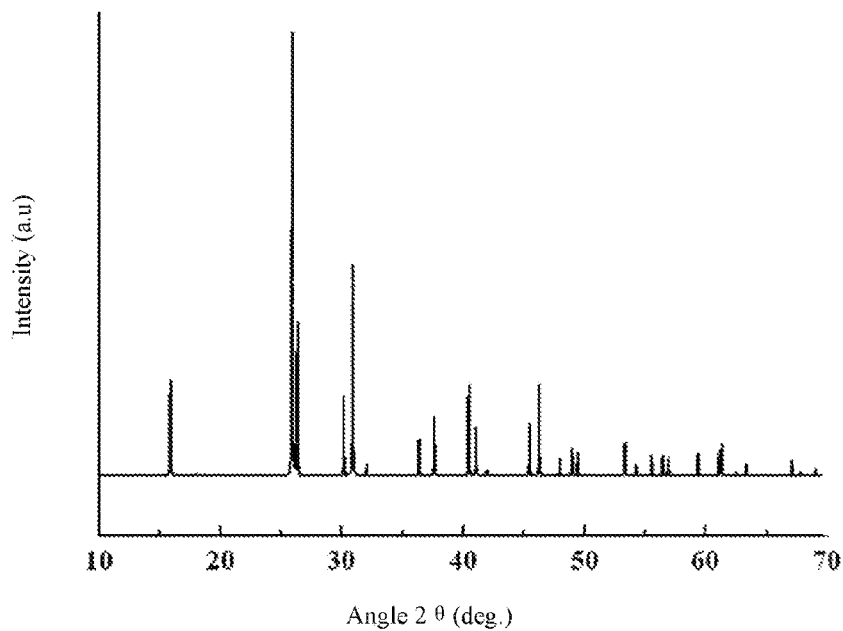
FIG. 1 is a powder XRD pattern of the $Cs_2B_4SiO_9$ compound of the present invention.

$Cs_2CO_3$, $SiO_2$ and $H_3BO_3$ were weighed at a molar ratio of 1:1:4 and put into a mortar, mixed uniformly and grinded carefully, loaded into a Φ100 mm×100 mm open type corundum crucible and then compressed tightly; the corundum crucible was placed into a muffle furnace, which was heated slowly to temperature of 550° C., held at this temperature for 24 hours and then cooled down to room temperature; the mixture was taken out winded once again and then put back to the muffle furnace, which was heated to a temperature of 650° C., held at this temperature for 24 hours, and then cooled to room temperature; the mixture was taken out, grinded for the third time and then put back to the muffle furnace, which was further heated to 780° C. and held at this temperature for 48 hours; the mixture was taken out and winded to obtain the single-phase polycrystalline powder of a $Cs_2B_4SiO_9$ compound; the powder XRD pattern assay showed that the powder XRD pattern of the $Cs_2B_4SiO_9$ powder (FIG. 1) is consistent with the theoretical XRD pattern of the single crystal structure, which verifies the synthesis of single-phase polycrystalline powder of the $Cs_2B_4SiO_9$ compound;

The obtained single-phase polycrystalline powder of $Cs_2B_4SiO_9$ and a fluxing agent $Cs_2CO_3$ were mixed at a molar ratio of $Cs_2B_4SiO_9$:$Cs_2CO_3$=1:0.5 and then loaded into a Φ80 mm×80 mm open type platinum crucible; the platinum crucible was heated to a temperature of 900° C. and held at this temperature for 15 hours to obtain a mixed melting liquid, the temperature was then decreased to 835° C. and further decreased to room temperature slowly at a rate of 1° C./h, allowing for spontaneous crystallization to obtain a $Cs_2B_4SiO_9$ seed crystal;

The crystal was grown in the melting liquid of the compound: the obtained $Cs_2B_4SiO_9$ seed crystal was attached onto a seed crystal rod for forming the seed crystal from the top of a crystal growing furnace; the seed crystal was preheated on the surface of the mixed melting liquid for 10 minutes, and then immersed underneath the liquid surface so that the seed crystal was remelted in the mixed melting liquid; the temperature was kept for 30 minutes, and then decreased rapidly to a temperature of 730° C.

The temperature was further decreased at a rate of 2° C./day and the seed crystal rod was rotated at a rotation rate of 10 rpm; after the crystal stopped growing, the crystal was drawn out of the liquid surface and cooled to room temperature at a rate of 10° C./h to obtain a colorless and transparent $Cs_2B_4SiO_9$ crystal.

Example 2

A $Cs_2B_4SiO_9$ compound was synthesized according to the following reaction equation:

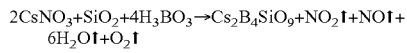

$$2CsNO_3 + SiO_2 + 4H_3BO_3 \rightarrow Cs_2B_4SiO_9 + NO_2\uparrow + NO\uparrow + 6H_2O\uparrow + O_2\uparrow$$

The starting materials $CsNO_3$, $SiO_2$ and $H_3BO_3$ were weighed directly at a molar ratio of 2:1:4, the weighed starting materials and a fluxing agent $Cs_2CO_3$ were mixed at a molar ratio of 1:5, and then loaded into a Φ80 mm×80 mm open type platinum crucible, the platinum crucible was heated to a temperature of 700° C. and held at this temperature for 60 hours to obtain a mixed melting liquid; the temperature was then decreased to 615° C. and further decreased to room temperature slowly at a rate of 1.5° C./h, allowing for spontaneous crystallization to obtain a $Cs_2B_4SiO_9$ seed crystal;

The obtained $Cs_2B_4SiO_9$ seed crystal was attached onto a seed crystal rod for forming the seed crystal from the top of a crystal growing furnace, the seed crystal was preheated on the surface of the mixed melting liquid for 10 minutes, and then immersed underneath the liquid surface so that the seed crystal was remelted in the mixed melting liquid; the temperature was kept for 30 minutes, and then decreased rapidly to a temperature of 710° C.;

The temperature was further decreased slowly at a rate of 1° C./day, after the crystal grown up to a desired size, the crystal was drawn out of the liquid surface and cooled to room temperature at a rate of 20° C./h; the crystal was then removed from the furnace and thus a colorless and transparent $Cs_2B_4SiO_9$ crystal was obtained.

Example 3

A $Cs_2B_4SiO_9$ compound was synthesized according to the following reaction equation:

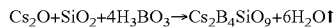

$$Cs_2O + SiO_2 + 4H_3BO_3 \rightarrow Cs_2B_4SiO_9 + 6H_2O\uparrow$$

$Cs_2O$, $SiO_2$ and $H_3BO_3$ were put into a mortar at a molar ratio of 1:1:4, mixed uniformly, grinded carefully, loaded into a Φ100 mm×100 mm open type corundum crucible and then compressed tightly; the corundum crucible was placed into a muffle furnace, which was heated slowly to a temperature of 550° C., held at this temperature for 24 hours and then cooled down to room temperature; the mixture was taken out, grinded once again and then put back to the muffle furnace, which was heated to a temperature of 650° C., held at this temperature for 24 hours, and then cooled to room temperature; the mixture was taken out, grinded for the third time and then put back to the muffle furnace, which was further heated to 800° C. and held at this temperature for 48 hours, the mixture was taken out and grinded to obtain the single-phase polycrystalline powder of a $Cs_2B_4SiO_9$ compound;

The obtained $Cs_2B_4SiO_9$ compound and a fluxing agent $Cs_2CO_3$—PhO (in which the molar ratio of $Cs_2CO_3$ to PhO was 1:1) were mixed at a molar ratio 1:5 and then loaded into a Φ80 min×80 mm open type platinum crucible; the platinum crucible was heated to a temperature of 820° C. and held at this temperature for 80 hours to obtain a mixed melting liquid, the temperature was then decreased to 710° C. and further decreased to room temperature slowly at a rate of 2.5° C./h, allowing for spontaneous crystallization to obtain a $Cs_2B_4SiO_9$ seed crystal;

The obtained $Cs_2B_4SiO_9$ seed crystal was attached onto a seed crystal rod for forming the seed crystal from the top of a crystal growing furnace; the seed crystal was preheated on the surface of the mixed melting liquid for 10 minutes, and then partly immersed underneath the liquid surface so that the seed crystal was remelted in the mixed melting liquid; the temperature was kept for 20 minutes, and then decreased rapidly to a temperature of 700° C.;

The temperature was further decreased slowly at a rate of 2° C./day; after the crystal grown up to a desired size, the crystal was drawn out of the liquid surface and cooled to room temperature at a rate of 30° C./h; the crystal was then removed from the furnace and thus a colorless and transparent $Cs_2B_4SiO_9$ crystal was obtained.

Example 4

A $Cs_2B_4SiO_9$ compound was synthesized according to the following reaction equation:

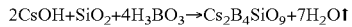

$$2CsOH + SiO_2 + 4H_3BO_3 \rightarrow Cs_2B_4SiO_9 + 7H_2O\uparrow$$

CsOH, $SiO_2$ and $H_3BO_3$ were weighed directly at a molar ratio of 2:1:4 to obtain a mixture. The mixture and a fluxing agent $Cs_2CO_3$—$H_3BO_3$ (in which the molar ratio of $Cs_2CO_3$ to $H_3BO_3$ was 1:1) were mixed at a molar ratio of 1:3, and then loaded into a Φ80 mm×80 mm open type platinum crucible; the platinum crucible was heated to a temperature of 765° C. and held at this temperature for 10 hours to obtain a mixed melting liquid; the temperature was then decreased to 715° C. and further decreased to room temperature slowly at a rate of 2.5° C./h, allowing for spontaneous crystallization to obtain a $Cs_2B_4SiO_9$ seed crystal;

The obtained $Cs_2B_4SiO_9$ seed crystal was attached onto a seed crystal rod for forming the seed crystal from the top of a crystal growing furnace; the seed crystal was preheated on the surface of the mixed melting liquid for 5 minutes, and then immersed underneath the liquid surface so that the seed crystal was remelted in the mixed melting liquid; the temperature was kept for 5 minutes, and then decreased rapidly to a temperature of 700° C.;

The temperature was further decreased slowly at a rate of 2° C./day; after the crystal grown up to a desired size, it was drawn out of the liquid surface and cooled to room temperature at a rate of 40° C./h; the crystal was then removed from the furnace and thus a colorless and transparent $Cs_2B_4SiO_9$ crystal was obtained.

Example 5

A $Cs_2B_4SiO_9$ compound was synthesized according to the following reaction equation:

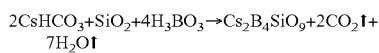

$$2CsHCO_3 + SiO_2 + 4H_3BO_3 \rightarrow Cs_2B_4SiO_9 + 2CO_2\uparrow + 7H_2O\uparrow$$

CsHCO$_3$, SiO$_2$ and H$_3$BO$_3$ were weighed directly at a molar ratio of 2:1:4 to obtain a mixture. The mixture and a fluxing agent H$_3$BO$_3$—PbO (in which the molar ratio of H$_3$BO$_3$ to PbO was 3:1) were mixed at a molar ratio of 1:5, and then loaded into a Φ80 mm×80 mm open type platinum crucible; the platinum crucible was heated to a temperature of 680° C. and held at this temperature for 60 hours to obtain a mixed melting liquid; the temperature was then decreased to 620° C. and further decreased down to room temperature slowly at a rate of 3.5° C./h, allowing for spontaneous crystallization to obtain a Cs$_2$B$_4$SiO$_9$ seed crystal;

The obtained Cs$_2$B$_4$SiO$_9$ seed crystal was attached onto a seed crystal rod for forming the seed crystal from the top of a crystal growing furnace; the seed crystal was preheated on the surface of the mixed melting liquid for 15 minutes, and then immersed underneath the liquid surface so that the seed crystal was remelted in the mixed melting liquid; the temperature was kept for 30 minutes, and then decreased rapidly to a temperature of 615° C.;

The temperature was further decreased slowly at a rate of 3° C./day; after the crystal grown up to a desired size, it was drawn out of the liquid surface and cooled to room temperature at a rate of 7° C./h; the crystal was then removed from the furnace and thus a colorless and transparent Cs$_2$B$_4$SiO$_9$ crystal was obtained.

Example 6

A Cs$_2$B$_4$SiO$_9$ compound was synthesized according to the following reaction equation:

$$Cs_2CO_3 + SiO_2 + 2B_2O_3 \rightarrow Cs_2B_4SiO_9 + CO_2\uparrow$$

Cs$_2$CO$_3$, SiO$_2$ and B$_2$O$_3$ were weighed directly at a molar ratio of 1:1:2 to obtain a mixture. The mixture and a fluxing agent H$_3$BO$_3$—PbO (in which the molar ratio of H$_3$BO$_3$ to PbO was 3:1) were mixed at a molar ratio of 1:5, and then loaded into a Φ80 mm×80 mm open type platinum crucible; the platinum crucible was heated to a temperature of 650° C. and held at this temperature for 80 hours to obtain a mixed melting liquid; the temperature was then decreased to 615° C. and further decreased down to room temperature slowly at a rate of 5° C./h, allowing for spontaneous crystallization to obtain a Cs$_2$B$_4$SiO$_9$ seed crystal;

The obtained Cs$_2$B$_4$SiO$_9$ seed crystal was attached onto a seed crystal rod for forming the seed crystal from the top of a crystal growing furnace; the seed crystal was preheated on the surface of the mixed melting liquid for 20 minutes, and then immersed underneath the liquid surface so that the seed crystal was remelted in the mixed melting liquid; the temperature was kept for 5 minutes, and then decreased rapidly to a temperature of 610° C.

The temperature was further decreased slowly at a rate of 3° C./day; after the crystal grown up to a desired size, it was drawn out of the liquid surface and cooled to room temperature at a rate of 15° C./h; the crystal was then removed from the furnace and thus a colorless and transparent Cs$_2$B$_4$SiO$_9$ crystal was obtained.

Example 7

A Cs$_2$B$_4$SiO$_9$ compound was synthesized according to the following reaction equation:

$$2CsNO_3 + SiO_2 + 2B_2O_3 \rightarrow Cs_2B_4SiO_9 + NO_2\uparrow + NO\uparrow + O_2\uparrow$$

CsNO$_3$, SiO$_2$ and B$_2$O$_3$ were weighed directly at a molar ratio of 2:1:2 to obtain a mixture. The mixture and a fluxing agent Cs$_2$CO$_3$—PbO (in which the molar ratio of Cs$_2$CO$_3$ to PbO was 5:3) were mixed at a molar ratio of 1:2, and then loaded into a Φ80 mm×80 mm open type platinum crucible; the platinum crucible was heated to a temperature of 660° C. and held at this temperature for 80 hours to obtain a mixed melting liquid; the temperature was then decreased to 610° C. and further decreased down to room temperature slowly at a rate of 10° C./h, allowing for spontaneous crystallization to obtain a Cs$_2$B$_4$SiO$_9$ seed crystal;

The obtained seed crystal was attached onto a seed crystal rod for forming the seed crystal from the top of a crystal growing furnace; the seed crystal was preheated on the surface of the mixed melting liquid for 25 minutes, and then partly immersed underneath the liquid surface so that the seed crystal was remelted in the mixed melting liquid; the temperature was kept for 25 minutes, and then decreased rapidly to a temperature of 600° C.;

The temperature was further decreased slowly at a rate of 5° C./day; after the crystal grown up to a desired size, it was drawn out of the liquid surface and cooled to room temperature at a rate of 35° C./h; the crystal was then removed from the furnace and thus a colorless and transparent Cs$_2$B$_4$SiO$_9$ crystal was obtained.

Example 8

A Cs$_2$B$_4$SiO$_9$ compound was synthesized according to the following reaction equation:

$$Cs_2O + SiO_2 + 2B_2O_3 \rightarrow Cs_2B_4SiO_9$$

Cs$_2$O, SiO$_2$ and B$_2$O$_3$ were put into a mortar at a molar ratio of 1:1:2, mixed uniformly, grinded carefully, loaded into a Φ100 mm×100 mm open type corundum crucible and then compressed tightly; the corundum crucible was placed into a muffle furnace, which was heated slowly to a temperature of 550° C., held at this temperature for 24 hours and then cooled down to room temperature; the mixture was taken out, grinded once again and then put back to the muffle furnace, which was heated to a temperature of 650° C., held at this temperature for 24 hours, and then cooled to room temperature; the mixture was taken out, grinded for the third time and then put back to the muffle furnace, which was further heated to 860° C. and held at this temperature for 48 hours; the mixture was taken out and grinded to obtain the single-phase polycrystalline powder of a Cs$_2$B$_4$SiO$_9$ compound;

The synthesized Cs$_2$B$_4$SiO$_9$ compound and a fluxing agent Cs$_2$CO$_3$—H$_3$BO$_3$ (in which the molar ratio of Cs$_2$CO$_3$ to H$_3$BO$_3$ was 2:2) were mixed at a molar ratio 1:4 and then loaded into a Φ80 mm×80 mm open type platinum crucible; the platinum crucible was heated to a temperature of 770° C. and held at this temperature for 70 hours to obtain a mixed melting liquid, the temperature was then decreased to 725° C. and further decreased to room temperature slowly at a rate of 4° C./h, allowing for spontaneous crystallization to obtain a Cs$_2$B$_4$SiO$_9$ seed crystal;

The obtained Cs$_2$B$_4$SiO$_9$ seed crystal was attached onto a seed crystal rod for forming the seed crystal from the top of a crystal growing furnace; the seed crystal was preheated on the surface of the mixed melting liquid for 8 minutes, and then immersed underneath the liquid surface so that the seed crystal was remelted in the mixed melting liquid; the temperature was kept for 8 minutes, and then decreased rapidly to a temperature of 720° C.;

The temperature was further decreased slowly at a rate of 0.8° C./day; after the crystal grown up to a desired size, the crystal was drawn out of the liquid surface and cooled to

Example 9

A $Cs_2B_4SiO_9$ compound was synthesized according to the following reaction equation:

$$2CsOH+SiO_2+2B_2O_3 \rightarrow Cs_2B_4SiO_9+H_2O\uparrow$$

CsOH, $SiO_2$ and $B_2O_3$ were put into a mortar at a molar ratio of 2:1:2, mixed uniformly, grinded carefully, and then loaded into a Φ100 mm×100 mm open type corundum crucible; the corundum crucible was placed into a muffle furnace, which was heated slowly to a temperature of 550° C., held at this temperature for 24 hours and then cooled down to room temperature; the mixture was taken out, grinded once again and then put back to the muffle furnace, which was heated to a temperature of 650° C., held at this temperature for 24 hours, and then cooled to room temperature, the mixture was taken out, grinded for the third time and then put back to the muffle furnace, which was further heated to 900° C. and held at this temperature for 3 hours; the mixture was taken out and grinded to obtain the single-phase polycrystalline powder of a $Cs_2B_4SiO_9$ compound;

The synthesized $Cs_2B_4SiO_9$ compound and a fluxing agent $H_3BO_3$—PhO (in which the molar ratio of $H_3BO_3$ to PhO was 2:1) were mixed at a molar ratio 1:4 and then loaded into a Φ80 mm×80 mm open type platinum crucible; the platinum crucible was heated to a temperature of 630° C. and held at this temperature for 45 hours to obtain a mixed melting liquid; the temperature was then decreased to 620° C. and further decreased to room temperature slowly at a rate of 6.5° C./h, allowing for spontaneous crystallization to obtain a $Cs_2B_4SiO_9$ seed crystal;

The obtained $Cs_2B_4SiO_9$ seed crystal was attached onto a seed crystal rod for forming the seed crystal from the top of a crystal growing furnace; the seed crystal was preheated on the surface of the mixed melting liquid for 15 minutes, and then immersed underneath the liquid surface so that the seed crystal was remelted in the mixed melting liquid; the temperature was kept for 15 minutes, and then decreased rapidly to a temperature of 615° C.;

The temperature was further decreased slowly at a rate of 2° C./day; after the crystal grown up to a desired size, the crystal was drawn out of the liquid surface and cooled to room temperature at a rate of 50° C./h; the crystal was then removed from the furnace and thus a colorless and transparent $Cs_2B_4SiO_9$ crystal was obtained.

Example 10

A $Cs_2B_4SiO_9$ compound was synthesized according to the following reaction equation:

$$2CsHCO_3+SiO_2+2B_2O_3 \rightarrow Cs_2B_4SiO_9+2CO_2\uparrow$$

$CsHCO_3$, $SiO_2$ and $B_2O_3$ were put into a mortar at a molar ratio of 2:1:2, mixed uniformly, grinded carefully, and then loaded into a Φ100 mm×100 mm open type corundum crucible; the corundum crucible was placed into a muffle furnace, which was heated slowly to a temperature of 550° C., held at this temperature for 24 hours and then cooled down to room temperature; the mixture was taken out, grinded once again and then put back to the muffle furnace, which was heated to a temperature of 650° C., held at this temperature for 24 hours, and then cooled to room temperature, the mixture was taken out, grinded for the third time and then put back to the muffle furnace, which was further heated to 700° C. and held at this temperature for 96 hours; the mixture was taken out and grinded to obtain the single-phase polycrystalline powder of a $Cs_2B_4SiO_9$ compound;

The synthesized $Cs_2B_4SiO_9$ compound and a fluxing agent $Cs_2CO_3$—PhO (in which the molar ratio of $Cs_2CO_3$ to PhO was 2:1) were mixed at a molar ratio 3:2 and then loaded into a Φ80 mm×80 mm open type platinum crucible, the platinum crucible was heated to a temperature of 900° C. and held at this temperature for 5 hours to obtain a mixed melting liquid, the temperature was then decreased to 750° C. and further decreased to room temperature slowly at a rate of 4.0° C./h, allowing for spontaneous crystallization to obtain a $Cs_2B_4SiO_9$ seed crystal;

The obtained $Cs_2B_4SiO_9$ seed crystal was attached onto a seed crystal rod for forming the seed crystal from the top of a crystal growing furnace, the seed crystal was preheated on the surface of the mixed melting liquid for 20 minutes, and then immersed underneath the liquid surface so that the seed crystal was remelted in the mixed melting liquid; the temperature was kept for 25 minutes, and then decreased rapidly to a temperature of 745° C.;

The temperature was further decreased slowly at a rate of 3° C./day; after the crystal grown up to a desired size, the crystal was drawn out of the liquid surface and cooled to room temperature at a rate of 45° C./h; the crystal was then removed from the furnace and thus a colorless and transparent $Cs_2B_4SiO_9$ crystal was obtained.

Example 11

A $Cs_2B_4SiO_9$ compound was synthesized according to the following reaction equation:

$$Cs_2C_2O_4+SiO_2+2B_2O_3 \rightarrow Cs_2B_4SiO_9+CO_2\uparrow+CO$$

$Cs_2C_2O_4$, $SiO_2$ and $B_2O_3$ were put into a mortar at a molar ratio of 1:1:2, mixed uniformly, grinded carefully, and then loaded into a Φ100 mm×100 mm open type corundum crucible; the corundum crucible was placed into a muffle furnace, which was heated slowly to a temperature of 550° C., held at this temperature for 24 hours and then cooled down to room temperature; the mixture was taken out, grinded once again and then put back to the muffle furnace, which was heated to a temperature of 650° C., held at this temperature for 24 hours, and then cooled to room temperature; the mixture was taken out, grinded for the third time and then put back to the muffle furnace, which was further heated to 810° C. and held at this temperature for 36 hours; the mixture was taken out and grinded to obtain the single-phase polycrystalline powder of a $Cs_2B_4SiO_9$ compound;

The synthesized $Cs_2B_4SiO_9$ compound and a fluxing agent $Cs_2CO_3$ were mixed at a molar ratio 1:3 and then loaded into a Φ80 mm×80 mm open type platinum crucible, the platinum crucible was heated to a temperature of 800° C. and held at this temperature for 50 hours to obtain a mixed melting liquid; the temperature was then decreased to 720° C. and further decreased to room temperature slowly at a rate of 4° C./h, allowing for spontaneous crystallization to obtain a $Cs_2B_4SiO_9$ seed crystal;

The obtained $Cs_2B_4SiO_9$ seed crystal was attached onto a seed crystal rod for forming the seed crystal from the top of a crystal growing furnace, the seed crystal was preheated on the surface of the mixed melting liquid for 20 minutes, and then immersed underneath the liquid surface so that the seed crystal was remelted in the mixed melting liquid; the temperature was kept for 25 minutes, and then decreased rapidly to a temperature of 715° C.;

The temperature was further decreased slowly at a rate of 2° C./day, after the crystal grown up to a desired size, the crystal was drawn out of the liquid surface and cooled to room temperature at a rate of 25° C./h; the crystal was then removed from the furnace and thus a colorless and transparent $Cs_2B_4SiO_9$ crystal was obtained.

Example 12

Figure 2:
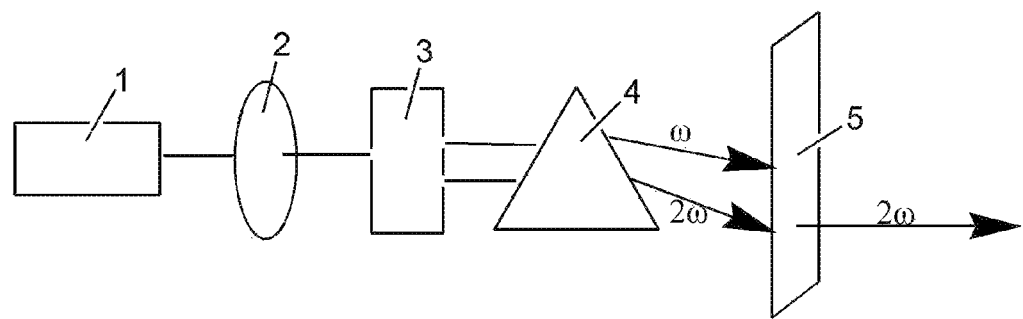
FIG. 2 is a working principle diagram of a nonlinear optical device made from the $Cs_2B_4SiO_9$ crystal of the present invention, wherein 1 is a laser generator, 2 is incident beam, 3 is a $Cs_2B_4SiO_9$ crystal, 4 is output beam and 5 is a filter.

The $Cs_2B_4SiO_9$ crystal obtained in any one of Examples 1-11 was processed in a phase-matching orientation into a frequency doubling device with a size of 5 mm×5 mm×6 mm, and disposed at the position of 3 as shown in FIG. 2. At room temperature, a Q-switched Nd:YAG laser generator was used as a light source and the incident light had a wavelength of 1064 nm. The infrared light beam 2 with a wavelength of 1064 nm emitted by the Q-switched Nd:YAG laser generator 1 shot into the $Cs_2B_4SiO_9$ single crystal 3 to generate a green frequency doubling light with a wavelength of 532 nm which has an output intensity 5 times as stronger as that of KDP under the equivalent conditions. The output beam 4 comprising the infrared light with a wavelength of 1064 nm and the green light with a wavelength of 532 nm was filtered by a filter 5 to obtain a green laser with a wavelength of 532 nm.

The invention claimed is:

1. A cesium borosilicate compound, wherein the compound has a chemical formula of $Cs_2B_4SiO_9$ with a molecular weight of 481.15.

2. A method for preparing the cesium borosilicate compound according to claim 1, wherein the method is conducted according to the following steps of:
   a. a Cs-containing compound, a B-containing compound and a Si-containing compound are mixed uniformly at a molar ratio of Cs:B:Si=2:4:1, grinded, loaded into a Φ100 mm×100 mm open type corundum crucible and then compressed tightly; the corundum crucible is placed into a muffle furnace, which is heated slowly to a temperature of 550° C., held at this temperature for 24 hours and then cooled down to room temperature; the mixture is taken out, grinded once again and then put back to the muffle furnace, which is heated to 650° C., held at this temperature for 24 hours and then cooled down to room temperature; the mixture is taken out, grinded for the third time and then put back to the muffle furnace, which is further heated to 700-900° C. and held at this temperature for 3-96 hours; the mixture is taken out and grinded to obtain the single-phase polycrystalline powder of a $Cs_2B_4SiO_9$ compound;
   b. the obtained single-phase polycrystalline powder of the $Cs_2B_4SiO_9$ compound is mixed with a fluxing agent at a molar ratio of 1:0.5-10 and then loaded into a Φ80 mm×80 mm open type platinum crucible; the platinum crucible is heated to a temperature ranging from 630° C. to 900° C. and held at this temperature range for 5-80 hours to obtain a mixed melting liquid; the temperature is then decreased to 610-835° C. and further decreased to room temperature at a temperature-decreasing rate of 1-10° C./h, allowing for spontaneous crystallization to obtain a $Cs_2B_4SiO_9$ seed crystal;
   c. crystals are grown in the mixed melting liquid: the obtained $Cs_2B_4SiO_9$ seed crystal is attached onto a seed crystal rod for forming the seed crystal from the top of a crystal growing furnace; the seed crystal is preheated on the surface of the mixed melting liquid for 10 minutes, and then immersed underneath the liquid surface so that the seed crystal is remelted in the mixed melting liquid; the temperature is kept for 30 minutes, and decreased rapidly to a temperature ranging from 610° C. to 745° C.;
   d. the temperature is further decreased at a rate of 2° C./day and the seed crystal rod is rotated at a rotation rate of 10 rpm; after the crystal stops growing, the crystal is drawn out of the liquid surface and cooled down to room temperature at a rate of 5-50° C./h to obtain the cesium borosilicate compound, the cesium borosilicate compound being a colorless and transparent large-size nonlinear optical crystal of $Cs_2B_4SiO_9$; said fluxing agent is $Cs_2CO_3$, a $Cs_2CO_3$—$H_3BO_3$ system, a PbO—$H_3BO_3$ system, or a $Cs_2CO_3$—PbO system.

3. The method according to claim 2, wherein said Cs-containing compound is $Cs_2CO_3$, $CsNO_3$, $Cs_2O$, CsOH, $CsHCO_3$ or $Cs_2C_2O_4$; said Si-containing compound is $SiO_2$; said B-containing compound is $H_3BO_3$ or $B_2O_3$.

4. The method according to claim 2, wherein the molar ratio of $Cs_2CO_3$ to $H_3BO_3$ is 1-5:1-3 in said $Cs_2CO_3$-$H_3BO_3$ system; the molar ratio of PbO to $H_3BO_3$ is 1-5:1-3 in said PbO-$H_3BO_3$ system; and the molar ratio of $Cs_2CO_3$ to PbO is 1-5:0.2-3 in said $Cs_2CO_3$—PbO system.

5. A method for preparing the cesium borosilicate compound according to claim 1, wherein the method is conducted according to the following steps of:
   a. a Cs-containing compound, a B-containing compound and a Si-containing compound are mixed uniformly at a molar ratio of Cs:B:Si=2:4:1, loaded into a Φ80 mm×80 mm open type platinum crucible; the platinum crucible is heated to a temperature ranging from 630° C. to 900° C. and held at this temperature range for 5-80 hours to obtain a mixed melting liquid; the temperature is then decreased to 610-835° C. and further decreased to room temperature at a temperature-decreasing rate of 1-10° C./h, allowing for spontaneous crystallization to obtain a $Cs_2B_4SiO_9$ seed crystal;
   b. crystals are grown in the mixed melting liquid: the obtained $Cs_2B_4SiO_9$ seed crystal is attached onto a seed crystal rod for forming the seed crystal from the top of a crystal growing furnace; the seed crystal is preheated on the surface of the mixed melting liquid for 10 minutes, and then immersed underneath the liquid surface so that the seed crystal is remelted in the mixed melting liquid; the temperature is kept for 30 minutes, and decreased rapidly to a temperature ranging from 610° C. to 745° C.;
   c. the temperature is further decreased at a rate of 2° C./day and the seed crystal rod is rotated at a rotation rate of 10 rpm; after the crystal stops growing, the crystal is drawn out of the liquid surface and cooled down to room temperature at a rate of 5-50° C./h to obtain the cesium borosilicate compound, the cesium borosilicate compound being a colorless and transparent large-size nonlinear optical crystal of $Cs_2B_4SiO_9$; said fluxing agent is $Cs_2CO_3$, a $Cs_2CO_3$-$H_3BO_3$ system, a PbO-$H_3BO_3$ system, or a $Cs_2CO_3$—PbO system.

6. The method according to claim 5, wherein said Cs-containing compound is $Cs_2CO_3$, $CsNO_3$, $Cs_2O$, CsOH, $CsHCO_3$ or $Cs_2C_2O_4$; said Si-containing compound is $SiO_2$; said B-containing compound is $H_3BO_3$ or $B_2O_3$.

7. The method according to claim 5, wherein the molar ratio of $Cs_2CO_3$ to $H_3BO_3$ is 1-5:1-3 in said $Cs_2CO_3$-$H_3BO_3$ system; the molar ratio of PbO to $H_3BO_3$ is 1-5:1-3 in said PbO-$H_3BO_3$ system; and the molar ratio of $Cs_2CO_3$ to PbO is 1-5:0.2-3 in said $Cs_2CO_3$—PbO system.

8. A cesium borosilicate nonlinear optical crystal, wherein the crystal has a chemical formula of $Cs_2B_4SiO_9$ with a molecular weight of 481.15; has no symmetric center; belongs to an tetragonal system; has a space group of 14 with unit cell parameters of a=6.731(3) Å, c=9.871(9) Å, V=447.2(5) Å$^3$; has a wide transmittance range with a shortest UV cut-off edge lower than 190 nm; has a powder frequency-doubling effect of 4.6 KDP.

9. A method for preparing the cesium borosilicate nonlinear optical crystal according to claim 8, wherein the method is conducted according to the following steps of:
  a. a Cs-containing compound, a B-containing compound and a Si-containing compound are mixed uniformly at a molar ratio of Cs:B:Si=2:4:1, grinded, loaded into a Φ100 mm×100 mm open type corundum crucible and then compressed tightly; the corundum crucible is placed into a muffle furnace, which is heated slowly to a temperature of 550° C., held at this temperature for 24 hours and then cooled down to room temperature; the mixture is taken out, grinded once again and then put back to the muffle furnace, which is heated to 650° C., held at this temperature for 24 hours and then cooled down to room temperature; the mixture is taken out, grinded for the third time and then put back to the muffle furnace, which is further heated to 700-900° C. and held at this temperature for 3-96 hours; the mixture is taken out and grinded to obtain the single-phase polycrystalline powder of a $Cs_2B_4SiO_9$ compound;
  b. the obtained single-phase polycrystalline powder of the $Cs_2B_4SiO_9$ compound is mixed with a fluxing agent at a molar ratio of 1:0.5-10 and then loaded into a Φ80 mm×80 mm open type platinum crucible; the platinum crucible is heated to a temperature ranging from 630° C. to 900° C. and held at this temperature range for 5-80 hours to obtain a mixed melting liquid; the temperature is then decreased to 610-835° C. and further decreased to room temperature at a temperature-decreasing rate of 1-10° C./h, allowing for spontaneous crystallization to obtain a $Cs_2B_4SiO_9$ seed crystal;
  c. crystals are grown in the mixed melting liquid: the obtained $Cs_2B_4SiO_9$ seed crystal is attached onto a seed crystal rod for forming the seed crystal from the top of a crystal growing furnace; the seed crystal is preheated on the surface of the mixed melting liquid for 10 minutes, and then immersed underneath the liquid surface so that the seed crystal is remelted in the mixed melting liquid; the temperature is kept for 30 minutes, and decreased rapidly to a temperature ranging from 610° C. to 745° C.;
  d. the temperature is further decreased at a rate of 2° C./day and the seed crystal rod is rotated at a rotation rate of 10 rpm; after the crystal stops growing, the crystal is drawn out of the liquid surface and cooled down to room temperature at a rate of 5-50° C./h to obtain the cesium borosilicate nonlinear optical crystal, the cesium borosilicate nonlinear optical crystal being a colorless and transparent large-size nonlinear optical crystal of $Cs_2B_4SiO_9$;

said fluxing agent is $Cs_2CO_3$, a $Cs_2CO_3$—$H_3BO_3$ system, a PbO—$H_3BO_3$ system, or a $Cs_2CO_3$—PbO system.

10. The method according to claim 9, wherein said Cs-containing compound is $Cs_2CO_3$, $CsNO_3$, $Cs_2O$, CsOH, $CsHCO_3$ or $Cs_2C_2O_4$; said Si-containing compound is $SiO_2$; said B-containing compound is $H_3BO_3$ or $B_2O_3$.

11. The method according to claim 9, wherein the molar ratio of $Cs_2CO_3$ to $H_3BO_3$ is 1-5:1-3 in said $Cs_2CO_3$—$H_3BO_3$ system; the molar ratio of PbO to $H_3BO_3$ is 1-5:1-3 in said PbO—$H_3BO_3$ system; and the molar ratio of $Cs_2CO_3$ to PbO is 1-5:0.2-3 in said $Cs_2CO_3$—PbO system.

12. A method for preparing the cesium borosilicate nonlinear optical crystal according to claim 8, wherein the method is conducted according to the following steps of:
  a. a Cs-containing compound, a B-containing compound and a Si-containing compound are mixed uniformly at a molar ratio of Cs:B:Si=2:4:1, loaded into a Φ80 mm×80 mm open type platinum crucible; the platinum crucible is heated to a temperature ranging from 630° C. to 900° C. and held at this temperature range for 5-80 hours to obtain a mixed melting liquid; the temperature is then decreased to 610-835° C. and further decreased to room temperature at a temperature-decreasing rate of 1-10° C./h, allowing for spontaneous crystallization to obtain a $Cs_2B_4SiO_9$ seed crystal;
  b. crystals are grown in the mixed melting liquid: the obtained $Cs_2B_4SiO_9$ seed crystal is attached onto a seed crystal rod for forming the seed crystal from the top of a crystal growing furnace; the seed crystal is preheated on the surface of the mixed melting liquid for 10 minutes, and then immersed underneath the liquid surface so that the seed crystal is remelted in the mixed melting liquid; the temperature is kept for 30 minutes, and decreased rapidly to a temperature ranging from 610° C. to 745° C.;
  c. the temperature is further decreased at a rate of 2° C./day and the seed crystal rod is rotated at a rotation rate of 10 rpm; after the crystal stops growing, the crystal is drawn out of the liquid surface and cooled down to room temperature at a rate of 5-50° C./h to obtain the cesium borosilicate nonlinear optical crystal, the cesium borosilicate nonlinear optical crystal being a colorless and transparent large-size nonlinear optical crystal of $Cs_2B_4SiO_9$;
  said fluxing agent is $Cs_2CO_3$, a $Cs_2CO_3$-$H_3BO_3$ system, a PbO-$H_3BO_3$ system, or a $Cs_2CO_3$—PbO system.

13. The method according to claim 12, wherein said Cs-containing compound is $Cs_2CO_3$, $CsNO_3$, $Cs_2O$, CsOH, $CsHCO_3$ or $Cs_2C_2O_4$; said Si-containing compound is $SiO_2$; said B-containing compound is $H_3BO_3$ or $B_2O_3$.

14. The method according to claim 12, wherein the molar ratio of $Cs_2CO_3$ to $H_3BO_3$ is 1-5:1-3 in said $Cs_2CO_3$-$H_3BO_3$ system; the molar ratio of PbO to $H_3BO_3$ is 1-5:1-3 in said PbO-$H_3BO_3$ system; and the molar ratio of $Cs_2CO_3$ to PbO is 1-5:0.2-3 in said $Cs_2CO_3$—PbO system.

* * * * *

UNITED STATES PATENT AND TRADEMARK OFFICE
CERTIFICATE OF CORRECTION

PATENT NO. : 9,751,774 B2  
APPLICATION NO. : 14/426094  
DATED : September 5, 2017  
INVENTOR(S) : Shilie Pan et al.

It is certified that error appears in the above-identified patent and that said Letters Patent is hereby corrected as shown below:

In the Claims

Column 13, Line 2,     Delete "group of 14",  
Claim 8     Insert -- group of $I\bar{4}$ --

Signed and Sealed this  
Sixteenth Day of October, 2018

Andrei Iancu  
*Director of the United States Patent and Trademark Office*